(12) United States Patent
Huang et al.

(10) Patent No.: US 12,068,380 B2
(45) Date of Patent: Aug. 20, 2024

(54) SEMICONDUCTOR STRUCTURES AND METHODS OF FORMING THE SAME

(71) Applicant: Taiwan Semiconductor Manufacturing Company, Ltd., Hsinchu (TW)

(72) Inventors: Chien-Hao Huang, Hsinchu (TW); Gao-Ming Wu, New Taipei (TW); Katherine H Chiang, New Taipei (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 115 days.

(21) Appl. No.: 17/577,037

(22) Filed: Jan. 17, 2022

(65) Prior Publication Data

US 2023/0141313 A1 May 11, 2023

Related U.S. Application Data

(60) Provisional application No. 63/278,460, filed on Nov. 11, 2021.

(51) Int. Cl.
*H01L 29/41* (2006.01)
*H01L 21/28* (2006.01)
(Continued)

(52) U.S. Cl.
CPC .... *H01L 29/41775* (2013.01); *H01L 29/4011* (2019.08); *H01L 29/42364* (2013.01)

(58) Field of Classification Search
CPC ....... H01L 29/66545; H01L 21/823821; H01L 21/845; H01L 29/1054; H01L 29/66803; H01L 29/66818; H01L 29/7853; H01L 29/7854; H01L 29/51; H01L 29/10; H01L 29/78; H01L 21/28; H01L 21/823857; H01L 21/28194; H01L 29/513; H01L 29/517; H01L 29/41775; H01L 29/4011; H01L 29/42364; H01L 29/41733; H01L 29/7869; H01L 27/1225; H01L 21/823431; H01L 27/0886; H01L 27/0924; H01L 27/10826; H01L 27/10879; H01L 27/1211; H01L 29/41791; H01L 29/66795–66818;
(Continued)

(56) References Cited

U.S. PATENT DOCUMENTS

2009/0148991 A1* 6/2009 Chung .............. H01L 29/66666
257/E21.41
2020/0373312 A1* 11/2020 Sharma ................. G11C 11/223
(Continued)

*Primary Examiner* — Moin M Rahman
(74) *Attorney, Agent, or Firm* — JCIPRNET

(57) ABSTRACT

Semiconductor structures and methods of forming the same are provided. A semiconductor structure includes gate electrodes and first insulation patterns laterally disposed and alternately arranged on a substrate, a gate dielectric layer disposed on the gate electrodes and the first insulation patterns, at least one channel pattern disposed on the gate dielectric layer, source electrodes and drain electrodes laterally disposed and alternately arranged on the channel pattern, and second insulation patterns disposed on the channel pattern between the source and drain electrodes. Besides, from a top view, each of the drain electrodes is overlapped with one of the first insulation patterns.

20 Claims, 15 Drawing Sheets

(51) Int. Cl.
*H01L 29/417* (2006.01)
*H01L 29/423* (2006.01)

(58) Field of Classification Search
CPC . H01L 29/785–7856; H01L 2029/7857–7858; H01L 2924/13067; H01L 29/04–045; H01L 29/02–365; H01L 29/16–1608; H01L 21/31051; H01L 27/0207; H01L 29/0649; H01L 21/32115; H01L 21/823828; H01L 29/66681; H01L 29/0657; H01L 29/4966; H01L 29/0882; H01L 29/4983; H01L 29/1037; H01L 29/0653; H01L 29/66659; H01L 29/7835; H01L 29/66689; H01L 29/7816; H01L 21/28088; H01L 23/5226; H01L 23/528; H01L 29/42324; H01L 29/4234; H01L 21/02532; H01L 21/02636; H01L 21/31111; H01L 21/31155; H01L 21/76802; H01L 21/76877; H01L 21/76897; H01L 29/40114; H01L 29/40117; H01L 29/7883; H01L 21/76831; H01L 21/76805; H10B 43/27; H10B 41/27; H10B 41/30; H10B 43/30; H10B 43/40; H10B 43/10; H10B 43/50; H10B 41/35; H10B 41/50; H10B 43/35; H10B 41/41; H10B 41/10; H10B 41/20; H10B 41/40; H10B 41/44; H10B 41/43; H10B 41/42; H10B 43/00; H10B 43/20; H10B 43/23; H10B 51/00; H10B 51/10; H10B 51/20; H10B 51/30; H10B 51/40; H10B 51/50; H10B 53/10; H10B 53/20; H10B 53/22; H10B 63/30; H10B 63/32; H10B 63/34; H10B 63/80; H10B 63/84; H10B 99/00; H10B 99/10; H10B 99/22

See application file for complete search history.

(56) References Cited

U.S. PATENT DOCUMENTS

2023/0035916 A1* 2/2023 Kim .................... H10B 12/033
2023/0051602 A1* 2/2023 Park .................. H01L 29/42392

* cited by examiner

SEMICONDUCTOR STRUCTURES AND METHODS OF FORMING THE SAME

CROSS-REFERENCE TO RELATED APPLICATION

This application claims the priority benefit of U.S. provisional application Ser. No. 63/278,460, filed on Nov. 11, 2021. The entirety of the above-mentioned patent application is hereby incorporated by reference herein and made a part of this specification.

BACKGROUND

In recent years, the semiconductor industry has experienced rapid growth due to continuous improvement in integration density of various electronic components, such as transistors, diodes, resistors, capacitors, or the like. Such improvement in integration density is mostly attributed to successive reductions in minimum feature sizes, which allows more components to be integrated into a given area.

As the integration density of various electronic components continues to increase, there exists an increasing number and complexity of wirings used to communicate those electronic components, and thus the length of interconnections is taken into consideration. Three-dimensional (3D) integration (e.g., integrating some components in a back end of line (BEOL) process) provides improved integration density and other advantages, such as faster speeds and higher bandwidth, because of the decreased length of interconnections between the components. Although the existing 3D integrated semiconductor structures have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
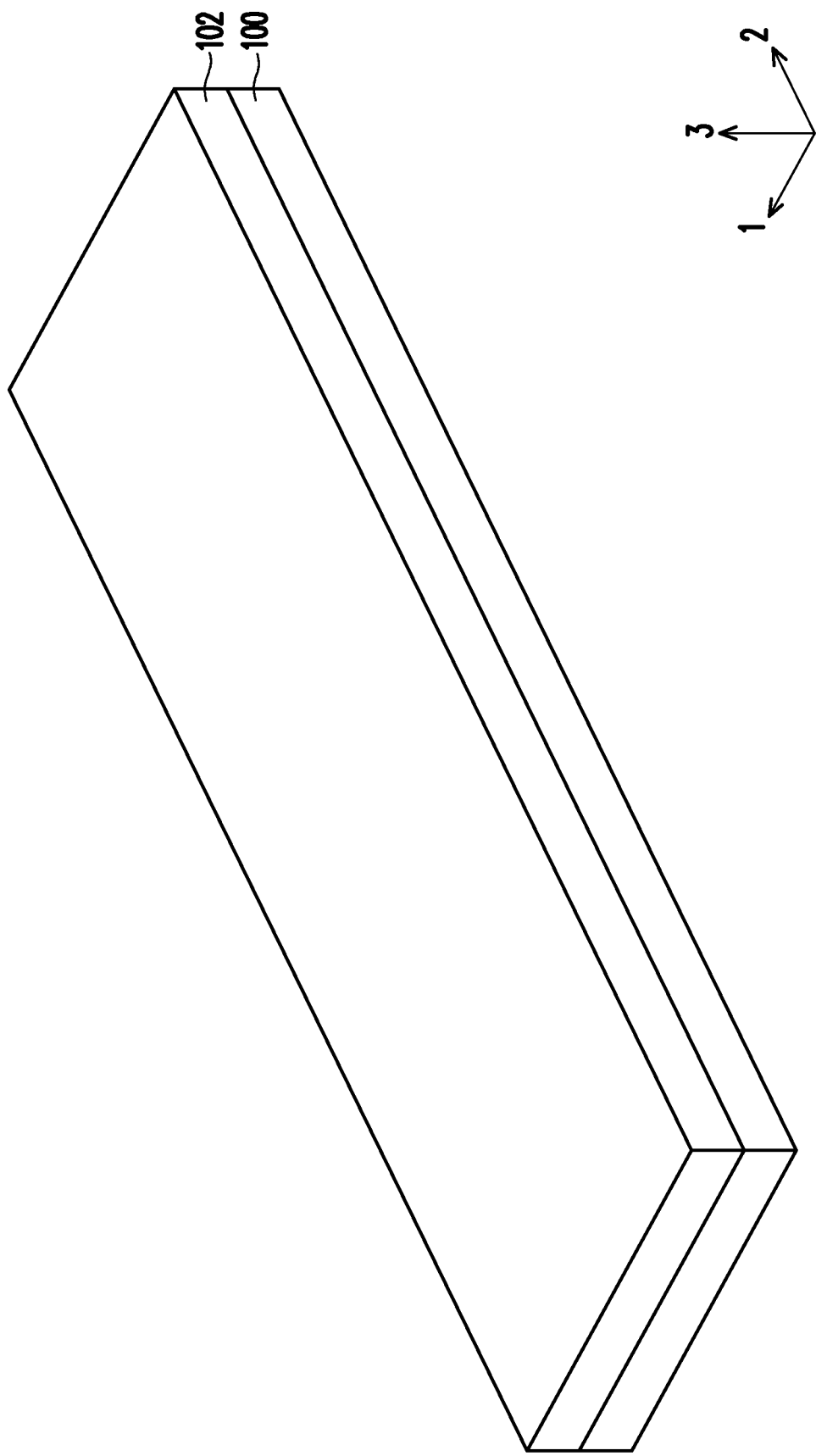
FIG. 1 to FIG. 8 are simplified perspective views of a method of forming a semiconductor structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments of the disclosure, a back-gate of a semiconductor structure is shifted to fully overlap the source electrode region and therefore the storage node region, so that the leakage current of the storage node is inhibited and the performance of the device is accordingly improved. Such shifted back-gate design can always fully control storage node considering every process/photolithography variation.

FIG. 1 to FIG. 8 are simplified perspective views of a method of forming a semiconductor structure in accordance with some embodiments. Throughout the various views and illustrative embodiments of the present disclosure, like reference numbers are used to designate like elements. It is understood that the disclosure is not limited by the method described below. Additional operations can be provided before, during, and/or after the method and some of the operations described below can be replaced or eliminated, for additional embodiments of the methods. Although FIG. 1 to FIG. 8 are described in relation to a method, it is appreciated that the structures disclosed in FIG. 1 to FIG. 8 are not limited to such a method, but instead may stand alone as structures independent of the method. FIG. 9 is a simplified cross-sectional view of a semiconductor structure in accordance with some embodiments. FIG. 10 is a simplified top view of a semiconductor structure in accordance with some embodiments.

Referring to FIG. 1, a substrate 100 is provided. In some embodiments, the substrate 100 includes a silicon substrate, a silicon-on-insulator (SOI) substrate, a silicon germanium substrate, or a suitable semiconductor substrate. Other semiconductor materials including group III, group IV, and group V elements may also be used. In some embodiments, shallow trench isolation regions (not shown) are formed in the substrate 100, which define different device regions such as NMOS and PMOS device regions (not shown). In some embodiments, the substrate 100 is a planar substrate without fins. In other embodiments, the substrate 100 is a substrate with fins. In other embodiments, the substrate 100 is a substrate with nanowires.

The substrate 100 may have a device layer 102. In some embodiments, the device layer 102 includes at least one device and an interconnection layer structure. The device is formed by a front end of line (FEOL) process and the interconnection layer structure is formed by a back end of line (BEOL) process, for example. The at least one device includes active components, passive components, or a combination thereof. The at least one device may include integrated circuits devices, such as transistors, capacitors, resistors, diodes, photodiodes, fuse devices, or the like. In some embodiments, the device includes a gate dielectric layer and a gate electrode formed on the substrate, a gate spacer formed aside the gate electrode, source and drain regions formed in the substrate aside the gate spacer, etc. Other components such as silicides within the contemplated scope of disclosure may also be included in the device.

The interconnection layer structure is formed over and electrically connected to the device. The interconnection layer structure includes interconnection features formed within interlayer dielectric (ILD) layers. The interconnection features include conductive lines, conductive vias or contacts, etc. Each of the interconnection features may include at least one conductive material, which can be a combination of a metallic barrier layer (such as a metallic nitride or a metallic carbide) and a metallic fill material. In some embodiments, the metallic barrier layer includes TiN, TaN, WN, TiC, TaC, and WC, and the metallic fill material portion includes W, Cu, Al, Co, Ru, Mo, Ta, Ti, an alloy thereof, or a combination thereof. The interconnection features may be formed by a suitable method, such as sputtering, electroplating, single damascene process, dual damascene process, or the like. Each of the dielectric layers may include a low-k dielectric layer (e.g., a dielectric with a dielectric constant less than about 3.9), an ultra-low-k dielectric layer (e.g., a dielectric with a dielectric constant less than about 3.0 or less than about 2.0), or an oxide (e.g., silicon oxide). In some embodiments, each of the dielectric layers includes a material such as silicon oxide, phosphosilicate glass (PSG), borophosphosilicate glass (BPSG), fluorosilicate glass (FSG), SiOC, Spin-On-Glass, Spin-On-Polymer, a silicon carbon material, a compound thereof, a composite thereof, the like, or a combination thereof. Other suitable materials within the contemplated scope of disclosure may also be used. Each of the dielectric layers may be formed by a suitable method, such as chemical vapor deposition (CVD), physical vapor deposition (PVD), atomic layer deposition (ALD), or the like.

Figure 2:
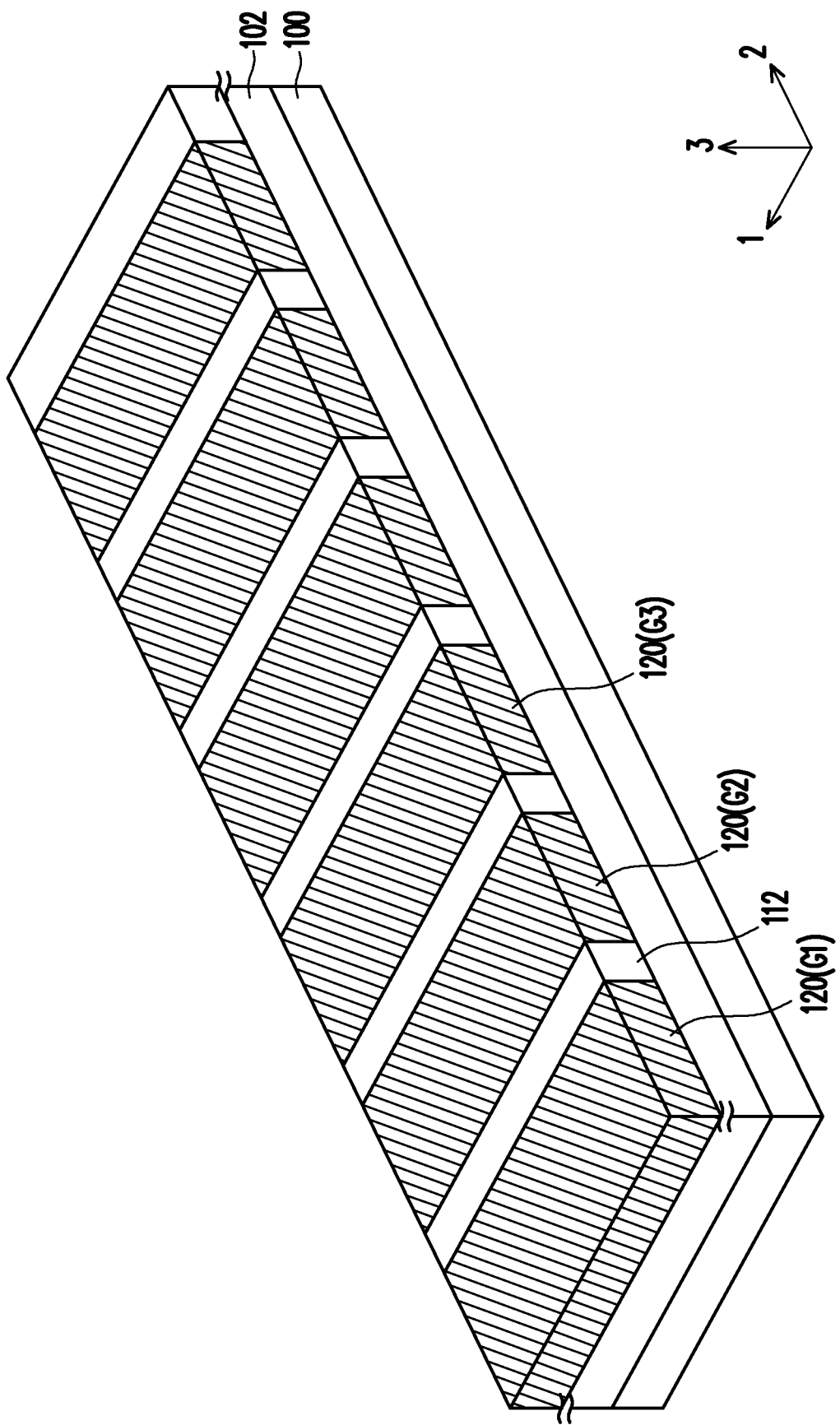

Referring to FIG. 2, insulation patterns 112 and gate electrodes 120 are formed over the substrate 100. In some embodiments, the insulation patterns 112 and the gate electrodes 120 are disposed laterally and arranged alternately on the substrate 100. The gate electrodes 120 may be electrically connected to the underlying device layer 102. For examples, the gate electrodes 120 may be electrically connected to vias of the interconnection layer structure of the device layer 102.

The insulation patterns 112 and the gate electrodes 120 may be formed by the following steps. In some embodiments, a base insulation layer is formed on the substrate 100. The base insulation layer may include a dielectric material, such as silicon oxide, silicon nitride, silicon oxynitride, a spin-on dielectric material, a low-k dielectric material (e.g., a dielectric with a dielectric constant less than about 3.9), an ultra-low-k dielectric layer (e.g., a dielectric with a dielectric constant less than about 3.0 or less than about 2.0), or the like. In some embodiments, the base insulation layer may be formed by a suitable method, such as CVD, PVD, ALD, or the like.

Thereafter, the base insulation layer is patterned to form first insulation patterns 112 spaced apart from each other on the substrate 100. In some embodiments, the first insulation patterns 112 may extend along a first direction D1 (e.g., Y-direction) and space apart from each other in a second direction D2 (e.g., X-direction) different from the first direction D1, but is not limited thereto. In some embodiments, the first direction D1 may interlace with the second direction D2. In other embodiments, the first direction D1 may be perpendicular to the second direction D2. In some embodiments, the first insulation patterns 112 may be formed by following steps. Firstly, a mask pattern (e.g., a photoresist layer) is formed on the base insulation layer. Then, portions of the base insulation layer exposed by the mask pattern are removed to form the first insulation patterns 112. The portions of the base insulation layer may be removed by an etching process. In some embodiments, the substrate 100 may include a buffer layer (e.g., SiN, SiC, SiCN, SiON, SiCON etc.) between the device layer 102 and the base insulation layer, and the buffer layer serves as an etch stop layer during the process of removing the portions of the base insulation layer. After forming the first insulation patterns 112, the mask pattern is removed by a suitable method, such as ashing.

Still referring to FIG. 2, gate electrodes 120 are formed on the substrate 100 between the first insulation patterns 112. In some embodiments, the gate electrodes 120 may extend along the first direction D1 and space apart from each other with the first insulation patterns 112 interposed therebetween. In some embodiments, the top surfaces of the gate electrodes 120 may be substantially coplanar with top surfaces of the first insulation patterns 112. In some embodiments, the gate electrodes 120 are formed by following steps. Firstly, a gate electrode layer is formed on the substrate 100, covering the first insulation patterns 112 and filling the trenches or gaps between the first insulation patterns 112. The gate electrode layer may be formed by a suitable method, such as CVD, PVD, ALD, or the like. Then, a planarization process (e.g., a chemical mechanical planarization (CMP) process) is performed to remove a portion of the gate electrode layer on the first insulation patterns 112 to form the gate electrodes 120. The gate electrodes 120 may include commonly used gate material such as doped polysilicon, metal (e.g., copper, tungsten, aluminum, etc.), silicide (e.g., titanium silicide, nickel silicide, etc.), or some other suitable conductive materials. In some embodiments, each of the gate electrodes 120 may include at least one conductive material, which can be a combination of a metallic barrier layer (such as a metallic nitride or a metallic carbide) and a metallic fill material. In some embodiments, the metallic barrier layer includes TiN, TaN, WN, TiC, TaC, and WC, and the metallic fill material portion includes W, Cu, Al, Co, Ru, Mo, Ta, Ti, an alloy thereof, or a combination thereof. In such case, the metallic barrier layer is disposed between the metallic fill material and the adjacent first insulation layer 112.

Figure 3:
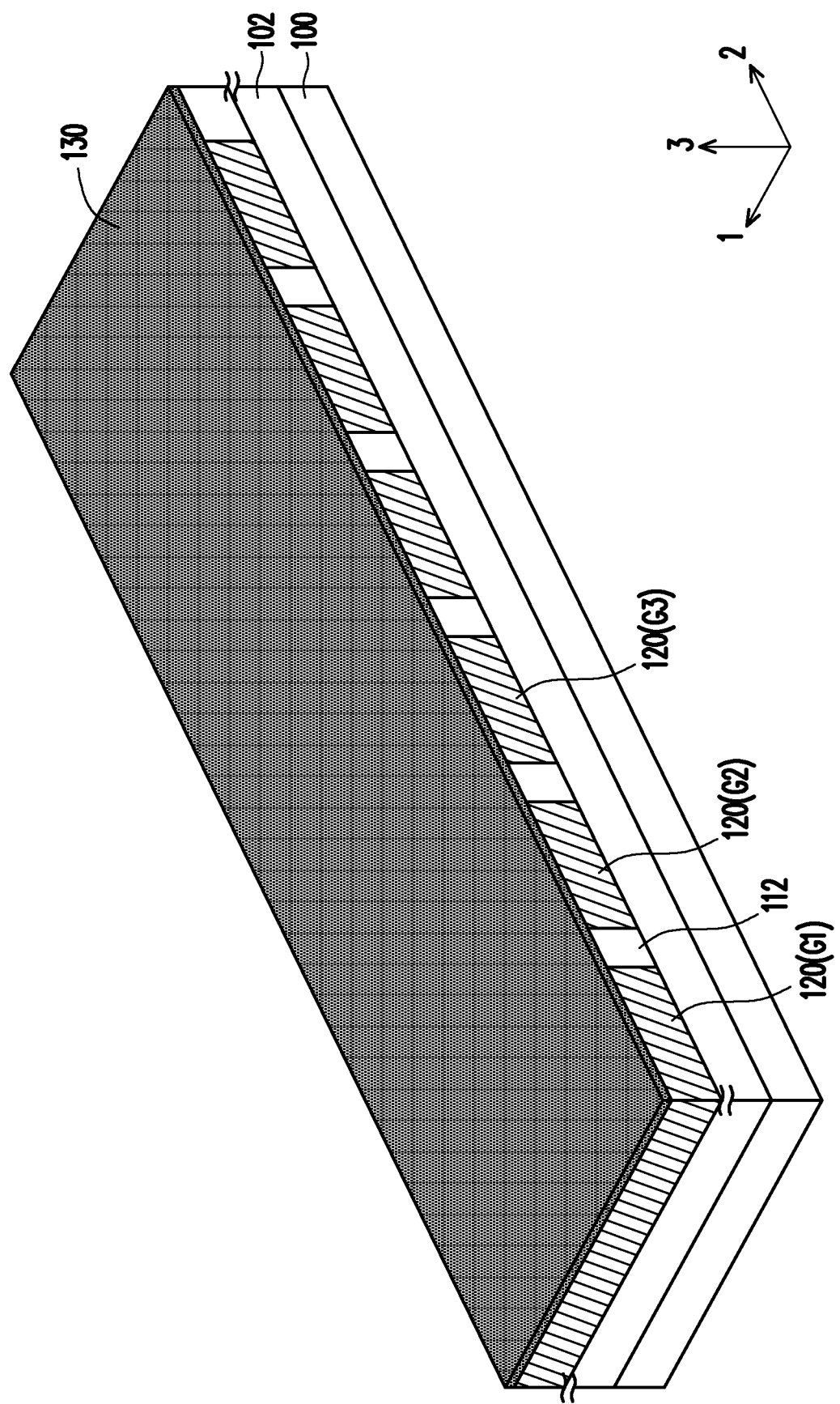

Referring to FIG. 3, a gate dielectric layer 130 is formed on the first insulation patterns 112 and the gate electrodes 120. The gate dielectric layer 130 may include oxide (e.g., silicon oxide), a high-k dielectric material (e.g., a dielectric material with a dielectric constant greater than 4 or even greater than 10), the like, or a combination thereof. The gate dielectric layer 130 may be formed by a suitable method, such as CVD, PVD, ALD, or the like.

Figure 4:
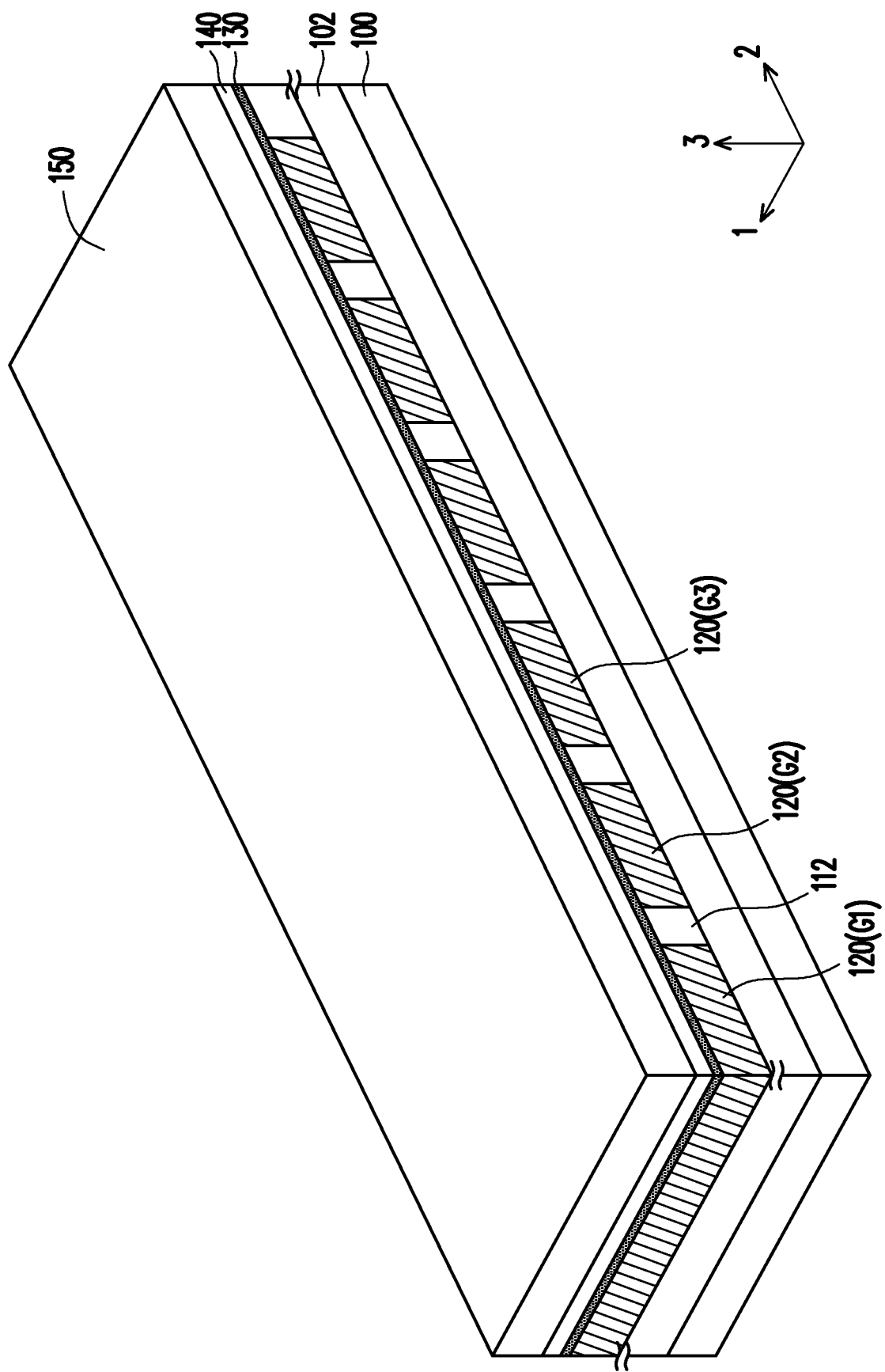

Referring to FIG. 4, a channel layer 140 is formed on the gate dielectric layer 130, and an insulation layer 150 is then formed on the channel layer 140. The channel layer is referred to as an "active layer" in some examples. In some embodiments, the channel layer 140 may include oxide semiconductor, such as indium gallium zinc oxide (IGZO), zinc oxide (ZnO), indium tungsten oxide (IWO), or the like. The channel layer 140 may be formed by a suitable method, such as CVD, PVD, ALD, or the like. In some embodiments, the insulation layer 150 may include a dielectric material, such as silicon oxide, silicon nitride, silicon oxynitride, a spin-on dielectric material, a low-k dielectric material (e.g., a dielectric with a dielectric constant less than about 3.9), an ultra-low-k dielectric layer (e.g., a dielectric with a dielectric constant less than about 3.0 or less than about 2.0), or the like. The insulation layer 150 may be formed by a suitable method, such as CVD, PVD, ALD, or the like.

Figure 5:
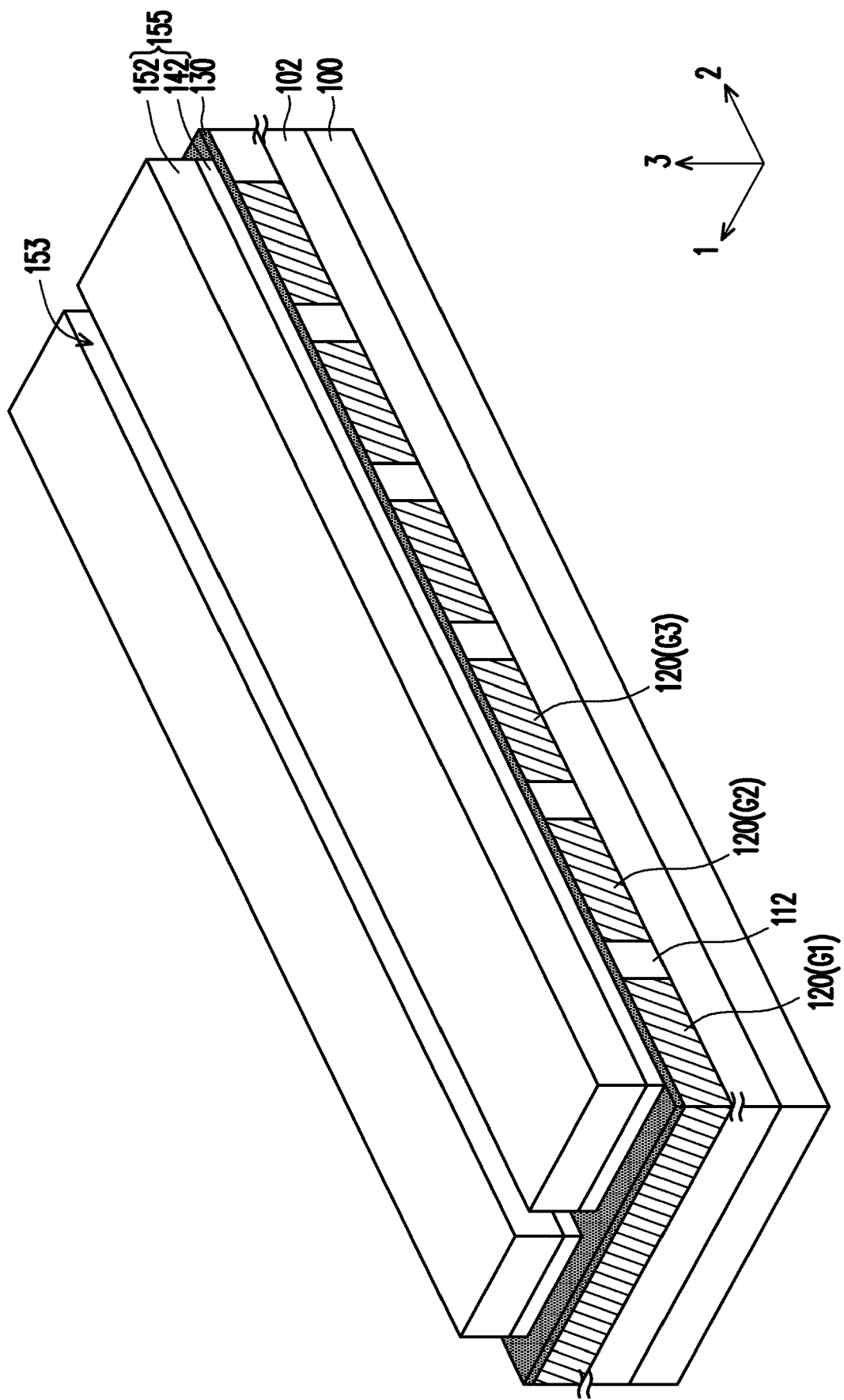

Referring to FIG. 5, the insulation layer 150 and the channel layer 140 are patterned to form stacks 155 spaced apart from each other on the gate dielectric layer 130. Trenches 153 are formed between the stacks 155. In some embodiments, each of the stacks 155 includes a channel pattern 142 on the gate dielectric layer 130 and an insulation strip 152 stacked on the channel pattern 142. In some embodiments, the stacks 155 may be arranged parallel to each other on the gate dielectric layer 130, but are not limited thereto. In some embodiments, the stacks 155 may be formed by following steps. Firstly, a mask pattern (e.g., a photoresist layer) is formed on the insulation layer 150. Then, portions of the insulation layer 150 exposed by the mask pattern and portions of the channel layer 140 under the portions of the insulation layer 150 are removed to form the stacks 155. The portions of the insulation layer 150 and the portions of the channel layer 140 may be removed by an etching process. The gate dielectric layer 130 may serve as a stop layer during the process of removing the portions of the insulation layer 150 and the portions of the channel layer 140. After forming the stacks 155, the mask pattern is removed by a suitable method, such as ashing.

In some embodiments, top surfaces of portions of the gate dielectric layer 130 exposed by the trenches 153 may be substantially coplanar with top surfaces of portions of the gate dielectric layer 130 under the stacks 155. In other embodiments, the top surfaces of the portions of the gate dielectric layer 130 exposed by the trenches 153 may be slightly over-etched during the process of patterning the insulation layer 150 and the channel layer 140, so that the top surfaces of the portions of the gate dielectric layer 130 exposed by the trenches 153 may be curved and lower than the top surfaces of the portions of the gate dielectric layer 130 under the stacks 155.

Figure 6:
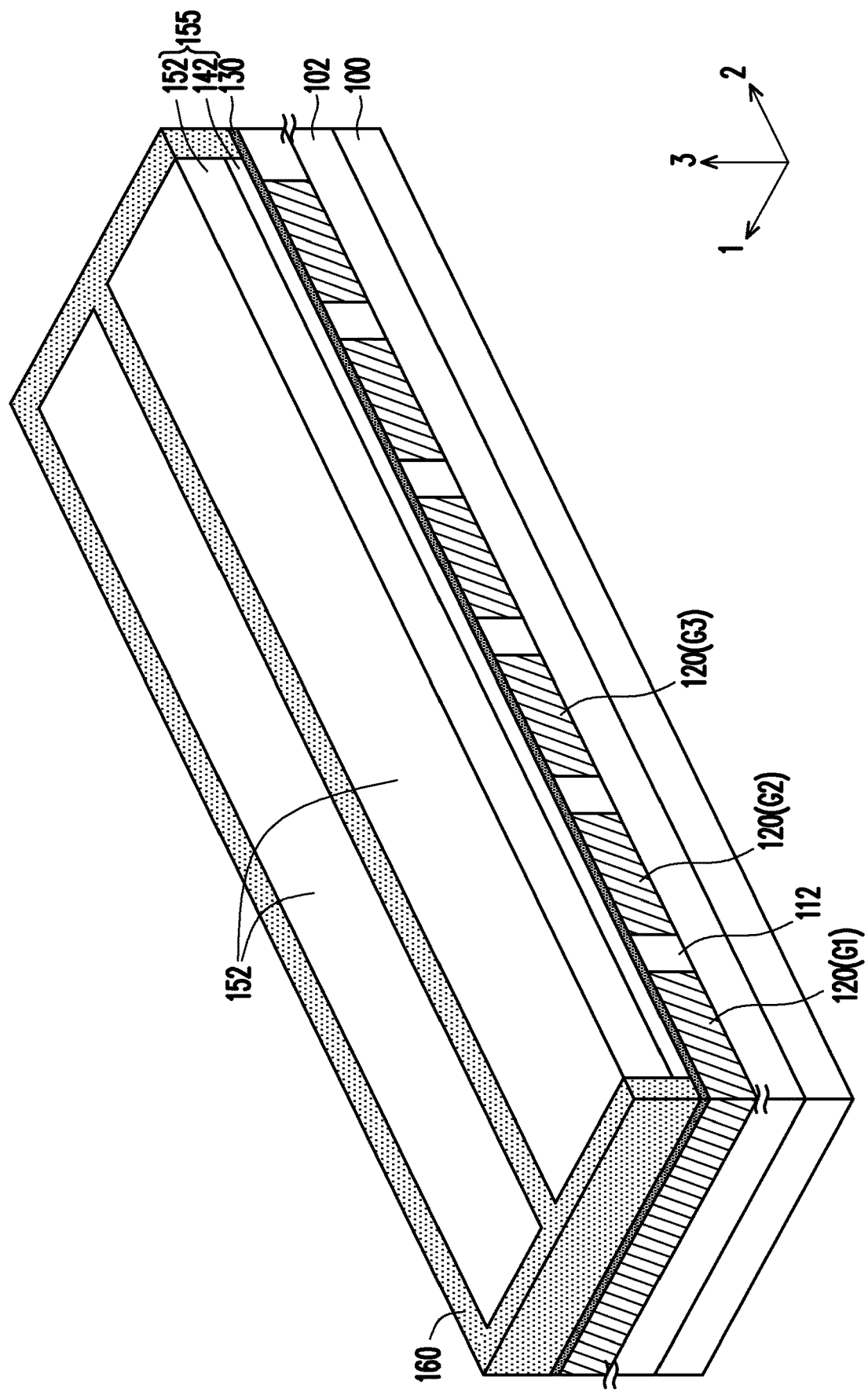

Referring to FIG. 6, an isolation pattern 160 is formed on the gate dielectric layer 130 to surround each of the stacks 155. In some embodiments, the isolation pattern 160 is formed as a grid or mesh pattern in a top view, and fills in the trenches 153 between the stacks 155. In some embodiments, the isolation pattern 160 may be formed by following steps. Firstly, an isolation material is formed on the gate dielectric layer 112 exposed by the stacks 155. The isolation material may cover top surfaces of the stacks 155 and fills in the trenches 153. Then, a planarization process (e.g., a CMP process) is performed to remove excessive isolation material, so that the remaining isolation material forms the isolation pattern 160 in the trenches 153 to surround each of the stacks 155. The isolation pattern 160 may include or may be formed of an insulating material having a different etch selectivity from the insulation strips 152. For example, the isolation pattern 160 includes metal oxide, such as aluminum oxide, titanium oxide, silicon nitride, or the like. In some embodiments, the isolation pattern 160 may include a material serving as an absorption source to protect the channel patterns 142 from being damaged by impurities and/or interstitial atoms (e.g., hydrogen atoms, oxygen atoms, or the like). The isolation material may be formed by a suitable method, such as CVD, PVD, ALD, or the like.

Figure 7:
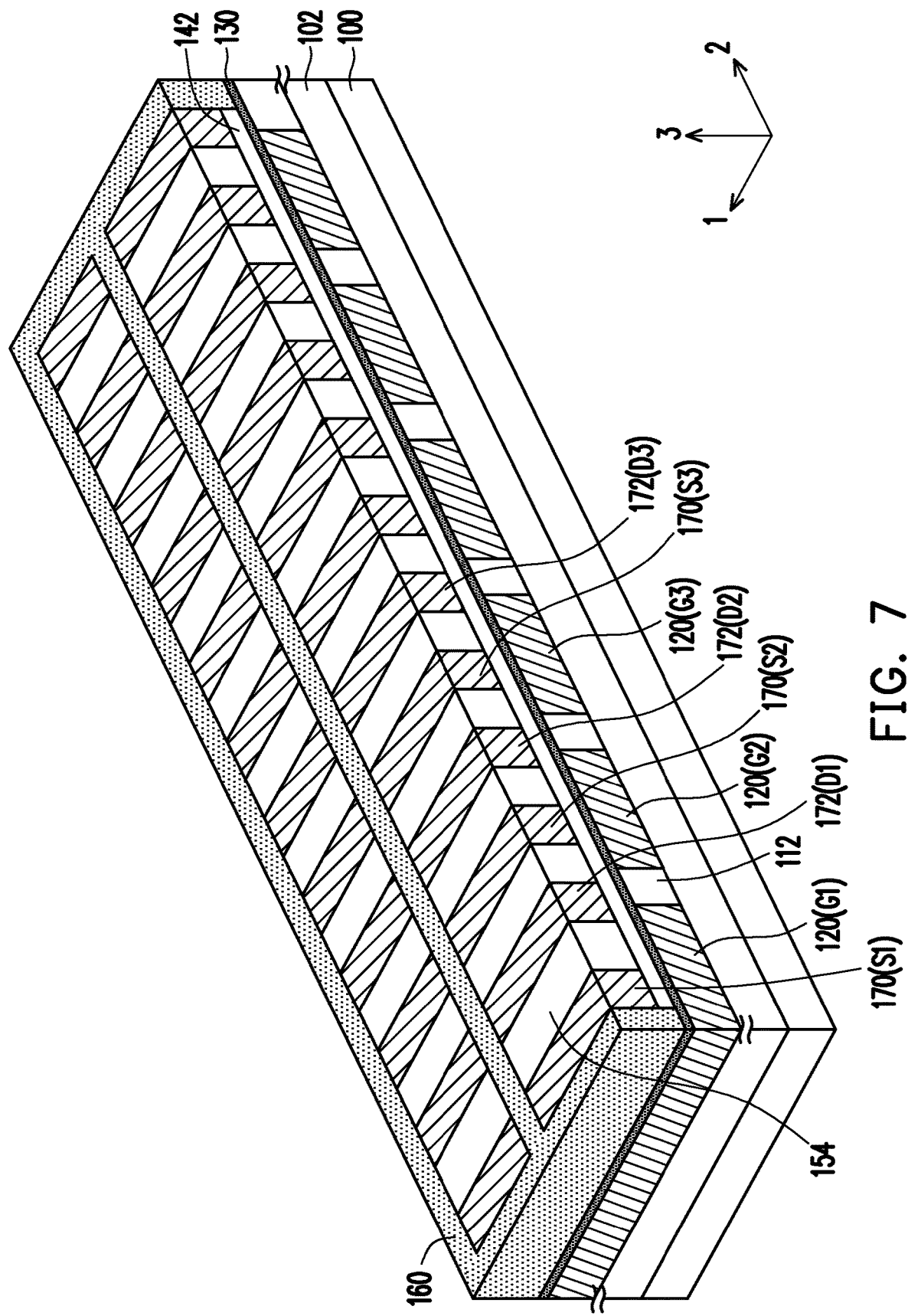

Referring to FIG. 7, each of the insulation strips 152 is patterned to form second insulation patterns 154 spaced apart from each other on each of the channel pattern 142. In some embodiments, the second insulation patterns 154 are formed by following steps. Firstly, a mask pattern (e.g., a photoresist layer) is formed on the insulation strips 152. Then, portions of the insulation strips 152 exposed by the mask pattern are removed to form the second insulation patterns 154. The portions of the insulation strips 152 may be removed by an etching process. The channel patterns 142 may serve as a stop layer during the process of removing the portions of the insulation strips 152. After forming the insulation strips 152, the mask pattern is removed by a suitable method, such as ashing.

Thereafter, source electrodes 170 and drain electrodes 172 are formed in trenches or gaps between the second insulation patterns 154 on each of the channel patterns 142. In some embodiments, the source electrodes 170 and the drain electrodes 172 are disposed laterally and arranged alternately on each of the channel patterns 142, and two adjacent source and drain electrodes 170 and 172 are separated by one of the second insulation patterns 154. The line-end source and/or drain electrodes 170 and 172 may be in physical contact with the isolation pattern 160. For example, the line-end source and drain electrodes 170 and 172 are in physical contact with the isolation pattern 160, as shown in FIG. 7.

In some embodiments, the source electrodes 170 and the drain electrodes 172 may be formed by following steps. Firstly, a conductive material is formed on the channel patterns 142, covering the second insulation patterns 154 and the isolation pattern 160 and filling the trenches or gaps between the second insulation patterns 154. The conductive material may be formed by a suitable method, such as CVD, PVD, or the like. Then, a planarization process (e.g., CMP process) is performed to remove a portion of the conductive material on the top surfaces of the second insulation patterns 154 and the top surface of the isolation pattern 160 to form the source electrodes 170 and the drain electrodes 172. The top surfaces of the source electrodes 170 and the drain electrodes 172 may be coplanar with the top surfaces of the second insulation patterns 154 and the isolation pattern 160. In some embodiments, the source and drain electrodes 170 and 172 are formed simultaneously and include the same material. In other embodiments, the source and drain electrodes 170 and 172 are formed separately and include different materials. In some embodiments, each of the source electrodes 170 and the drain electrodes 172 may include Al, Ti, TiN, W, Mo, indium tin oxide (ITO), or the like. In some embodiments, each of the of the source electrodes 170 and the drain electrodes 172 may include at least one conductive material, which can be a combination of a metallic barrier layer (such as a metallic nitride or a metallic carbide) and a metallic fill material. In some embodiments, the metallic barrier layer includes TiN, TaN, WN, TiC, TaC, and WC, and the metallic fill material portion includes W, Cu, Al, Co, Ru, Mo, Ta, Ti, an alloy thereof, or a combination thereof. In such case, the metallic barrier layer is disposed between the metallic fill material and each of the adjacent second insulation pattern 154, the channel pattern 142 and the isolation pattern 160.

Figure 8:
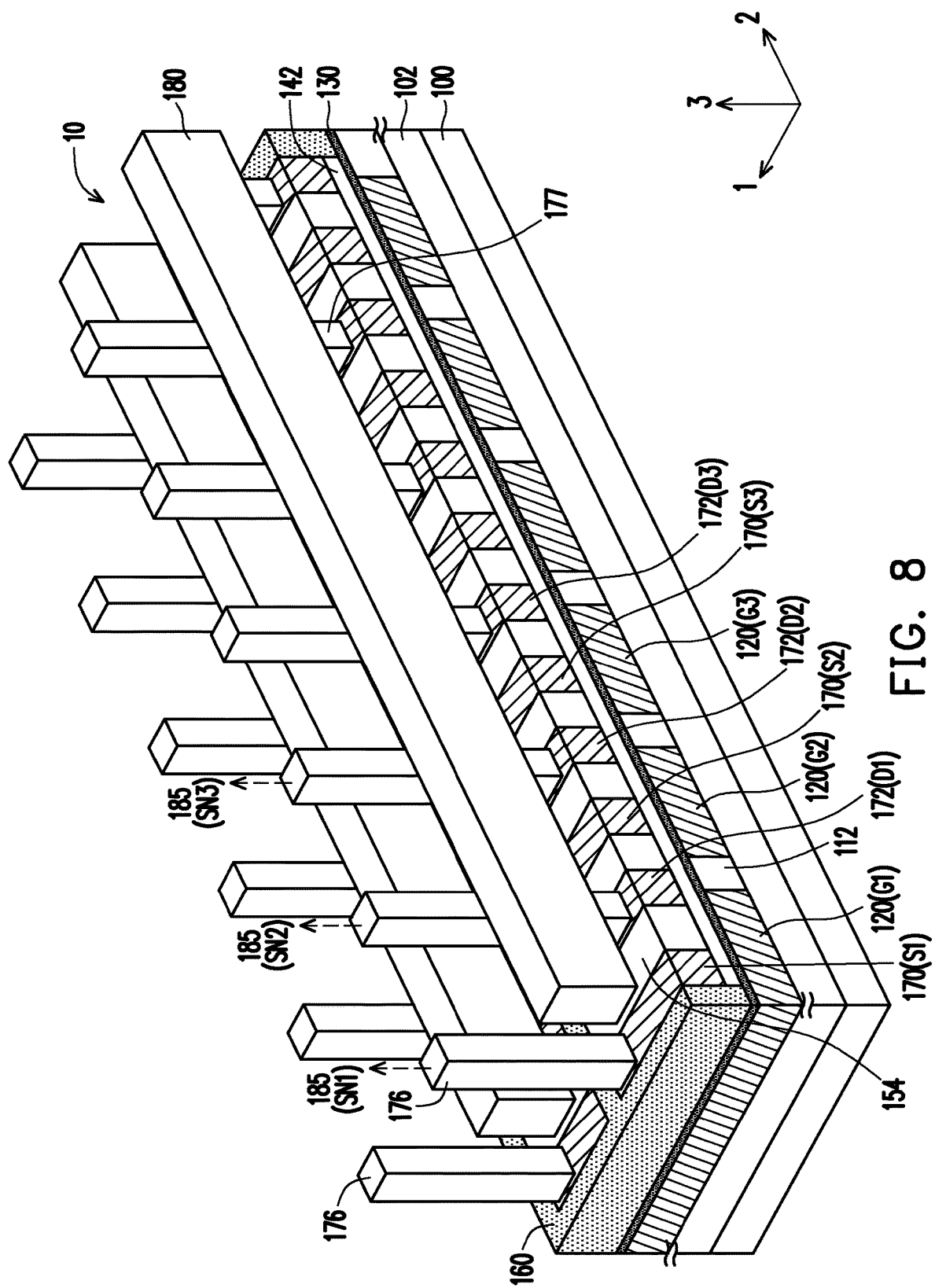
Figure 9:
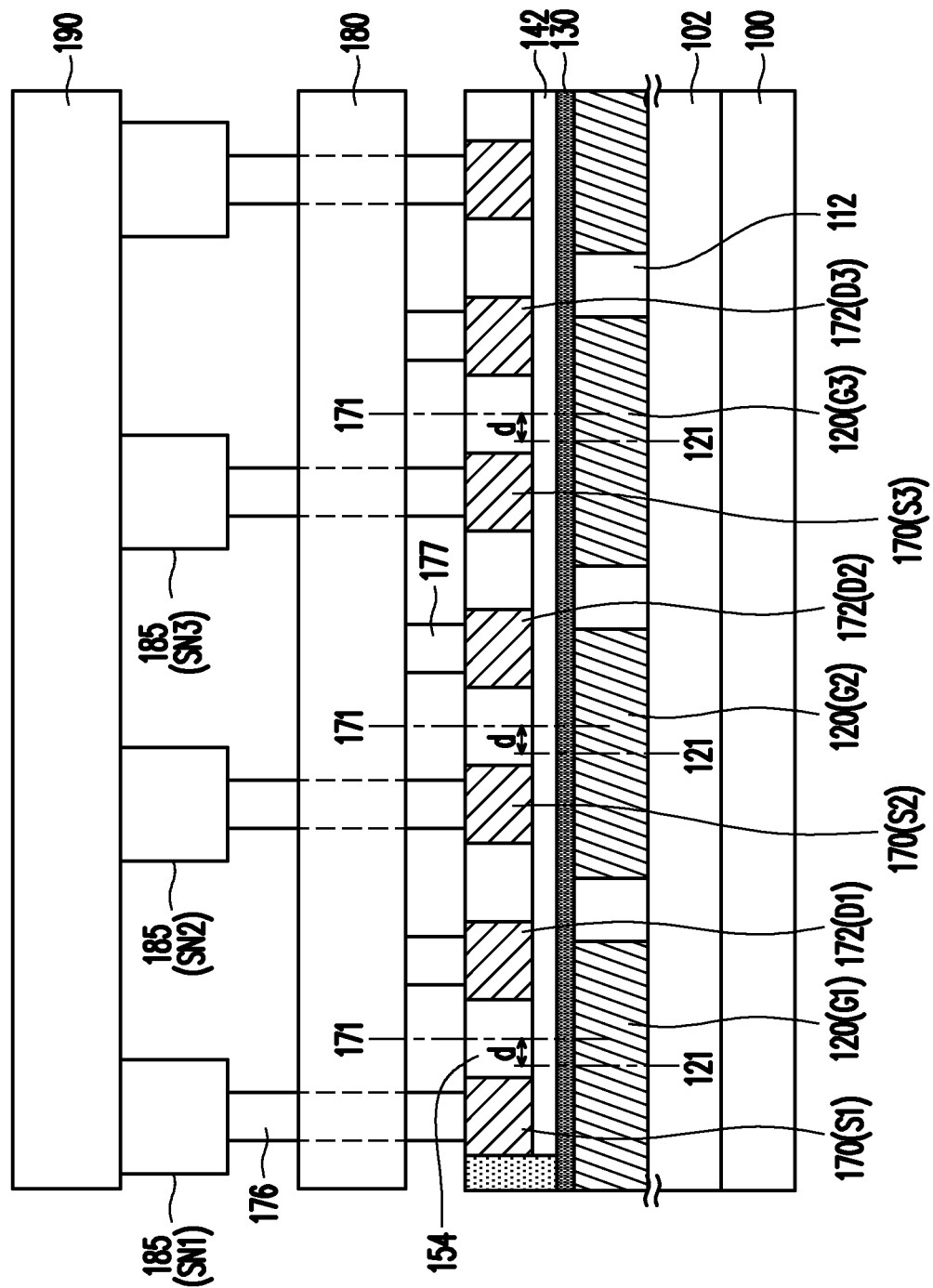
FIG. 9 is a simplified cross-sectional view of a semiconductor structure in accordance with some embodiments.
Figure 10:
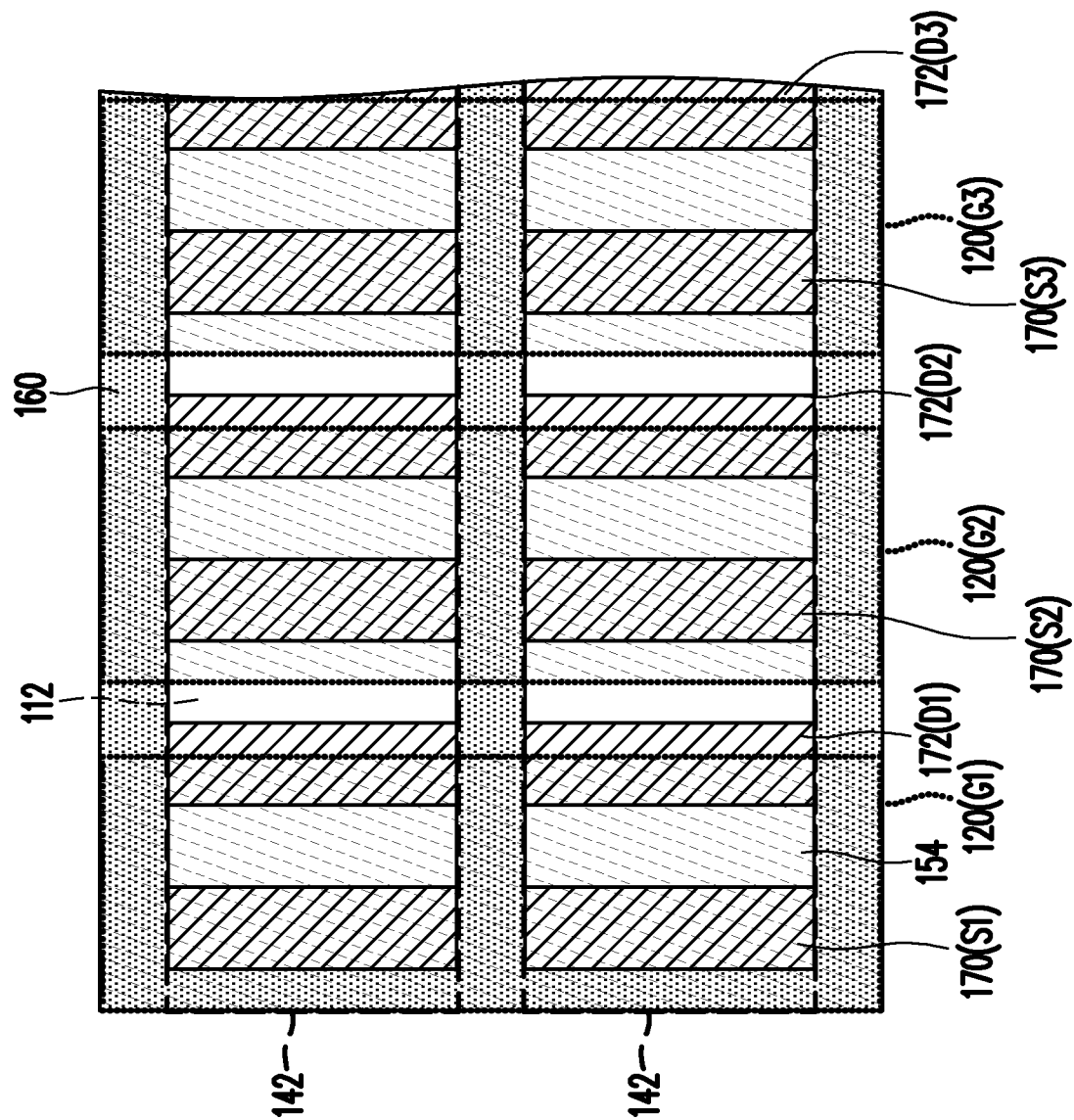
FIG. 10 is a simplified top view of a semiconductor structure in accordance with some embodiments.

Referring to FIG. 8 and FIG. 9, conductive vias 177 are formed over and electrically connected to the drain electrodes 172, and conductive lines 180 are formed over and electrically connected to the conductive vias 177. In some embodiments, the conductive vias 177 extend along a third direction D3 (e.g., Z-direction) different from the first direction D1 and the second direction D2. For example, the third direction D3 (e.g., Z-direction) is perpendicular to the first direction D1 (e.g., Y-direction) and the second direction D2 (e.g., X-direction). The conductive lines 180 extend along the second direction D2.

Each of the conductive vias 177 and the conductive lines 180 may include at least one conductive material, which can be a combination of a metallic barrier layer (such as a metallic nitride or a metallic carbide) and a metallic fill material. In some embodiments, the metallic barrier layer includes TiN, TaN, WN, TiC, TaC, and WC, and the metallic fill material portion includes W, Cu, Al, Co, Ru, Mo, Ta, Ti, an alloy thereof, or a combination thereof. Each of the conductive vias 177 and the conductive lines 180 may be formed by a suitable method, such as sputtering, electroplating, single damascene process, dual damascene process, or the like.

Still referring to FIG. 8 and FIG. 9, conductive vias 176 are formed over and electrically connected to the source electrodes 170, and conductive lines 190 are formed over and electrically connected to the conductive vias 176. In some embodiments, the conductive vias 176 extend along a third direction D3 (e.g., Z-direction) different from the first direction D1 and the second direction. For example, the third direction D3 (e.g., Z-direction) is perpendicular to the first direction D1 and the second direction D2. The conductive lines 190 extend along the second direction D2.

Each of the conductive vias 176 and the conductive lines 190 may include at least one conductive material, which can be a combination of a metallic barrier layer (such as a metallic nitride or a metallic carbide) and a metallic fill material. In some embodiments, the metallic barrier layer includes TiN, TaN, WN, TiC, TaC, and WC, and the metallic fill material portion includes W, Cu, Al, Co, Ru, Mo, Ta, Ti, an alloy thereof, or a combination thereof. Each of the conductive vias 176 and the conductive lines 190 may be formed by a suitable method, such as sputtering, electroplating, single damascene process, dual damascene process, or the like.

In some embodiments, a storage node 185 is formed between one of the conductive vias 176 and the corresponding conductive line 190. In some embodiments, each of the storage nodes 185 includes a capacitor, such as a metal-insulator-metal (MIM) capacitor, a planar capacitor, a U-shaped capacitor, a vertical capacitor, a horizontal capacitor, a non-capacitor storage structure, or the like.

Upon the formation of the storage nodes 185 and the conductive lines 190, a semiconductor device 10 of some embodiments is thus completed. In some embodiments, another interconnection layer structure (including lines, vias, pads, etc.) is formed over and electrically connected to the storage nodes 185. The another interconnection layer structure is formed by a back end of line (BEOL) process, for example. In some embodiments, the conductive lines 190 are regarded as part of the another interconnection layer structure.

In some embodiments, a transistor (e.g., thin film transistor (TFT)) is embedded in two adjacent lines of the interconnection structure. In some embodiments, the transistor includes a gate electrode 120, a first insulation pattern 112 disposed adjacent to the gate electrode 120, a gate dielectric layer 130 disposed over the gate electrode 120, a channel pattern 142 disposed over the gate dielectric layer 130, a source electrode 170 and a drain electrode 172 disposed over the channel pattern 142, and a second insulation pattern 154 disposed over the channel pattern 142 between the source electrode 170 and the drain electrode 172. Besides, each drain electrode 172 is partially overlapped with the underlying gate electrode 120 and the adjacent insulation pattern 120.

In some embodiments, for the purpose of simplicity and clarity of illustration, the gate electrodes 120 are described as G1, G2, G3 . . . , the source electrodes 170 are described as S1, S2, S3 . . . , the drain electrodes 170 are described as D1, D2, D3 . . . , and storage nodes 185 are described as SN1, SN2, SN3 . . . , starting from the left side of the figure.

In some embodiments, from the top view in FIG. 10, each of the source electrodes 172 is fully overlapped with one of the gate electrodes 120. Specifically, the source electrode S1 is fully overlapped with the gate electrodes G1, the source electrode S2 is fully overlapped with the gate electrodes G2, and the source electrode S3 is fully overlapped with the gate electrodes G3.

In some embodiments, from the cross-sectional view in FIG. 9 and the top view in FIG. 10, each of the drain electrodes 172 is partially overlapped with one of the gate electrodes 120 and partially overlapped with one of the first insulation patterns 112. Specifically, the drain electrode D1 is partially overlapped with the gate electrode G1 and the adjacent first insulation pattern 112, the drain electrode D2 is partially overlapped with the gate electrode G2 and the adjacent first insulation pattern 112, and the drain electrode D3 is partially overlapped with the gate electrode G3 and the adjacent first insulation pattern 112.

From another point of view, the boundary of each of the source electrodes 170 is fully within the boundary of one of the gate electrodes 120 in the third direction 3. Besides, each of the drain electrodes 172 may include a first portion overlapping with one of the gate electrodes 120 in the third direction 3, and a second portion overlapping with one of the first insulation pattern 152 in the third direction 3.

In some embodiments, from the cross-sectional view in FIG. 9, the central axis 171 between the adjacent source and drain electrodes 170 and 172 is shifted from the central axis 121 of the corresponding gate electrode 120 by a distance d, and d is greater than zero. Specifically, the central axis 171 between the adjacent source and drain electrodes S1 and D1 is shifted from the central axis 121 of the corresponding gate electrode G1, the central axis 171 between the adjacent source and drain electrodes S2 and D2 is shifted from the central axis 121 of the corresponding gate electrode G2, and the central axis 171 between the adjacent source and drain electrodes S3 and D3 is shifted from the central axis 121 of the corresponding gate electrode G3. The transistor of the disclosure is referred to as "a shifted back-gate transistor" in some examples, because the central axis 171 between the adjacent source and drain electrodes 170 and 172 shifted from (or misaligned with) the central axis 121 of the corresponding gate electrode 120.

In some embodiments, in the case where the semiconductor structure 10 is applied to a memory device such as DRAM, the source electrodes 170 may be connected to the storage nodes 185 through the conductive vias 176, the drain electrodes 172 may be connected to bit lines through the conductive vias 177, and the gate electrodes 120 may be connected to word lines. In some embodiments, as shown in FIG. 9, multiple shifted gate devices are provided, the source electrodes S1, S2 and S3 are respectively connected to the storage nodes SN1, SN2 and SN3, the drain electrodes D1, D2 and D3 are respectively connected to the conductive lines 180 serving as bit lines, and the gate electrodes G1, G2 and G3 serve as word lines.

In some embodiments of the disclosure, a back-gate of a semiconductor structure is shifted to fully overlap the source electrode region and therefore the storage node region, so that the leakage current of the storage node is inhibited and the performance of the device is accordingly improved. Such shifted back-gate design can always fully control storage node considering every process/photolithography variation Besides, a continuous active layer is provided for several TFTs. Specifically, in some embodiments, the disclosure can implement a continuous channel layer (e.g., a strip-like channel layer or active layer) by cutting a channel blanket layer along the back-gate arrangement direction, so as to save the process cost and process steps.

Although the embodiments of FIG. 1 through FIG. 10 illustrate that each drain electrode is partially overlapped with the underlying back-gate electrode and the adjacent insulation pattern, other configurations are also possible. For example, each drain electrode is fully overlapped with the underlying insulation pattern between two back-gate electrodes, as shown in FIG. 11 to FIG. 12.

Figure 11:
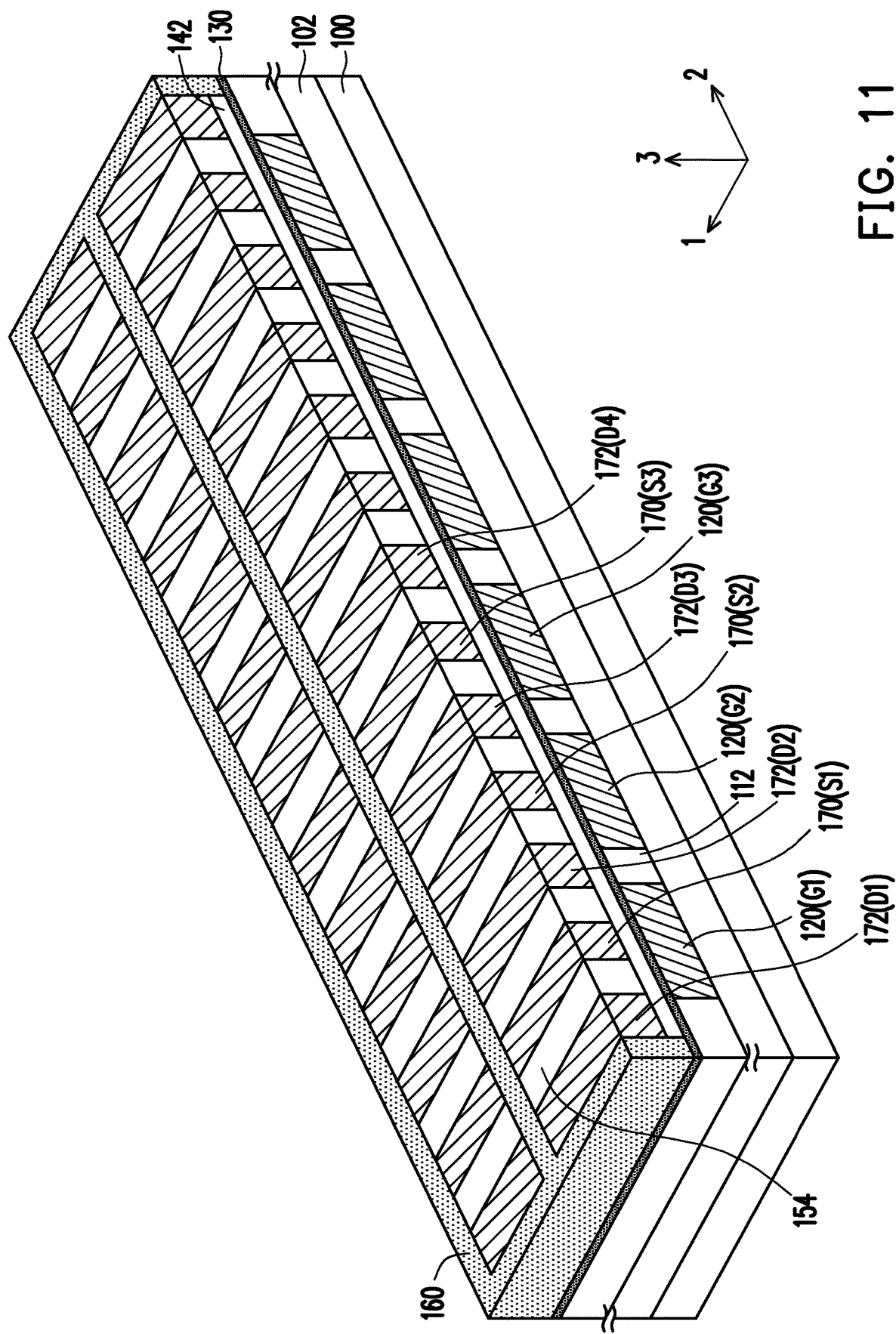
FIG. 11 to FIG. 12 are simplified perspective views of a method of forming a semiconductor structure in accordance with other embodiments.
Figure 12:
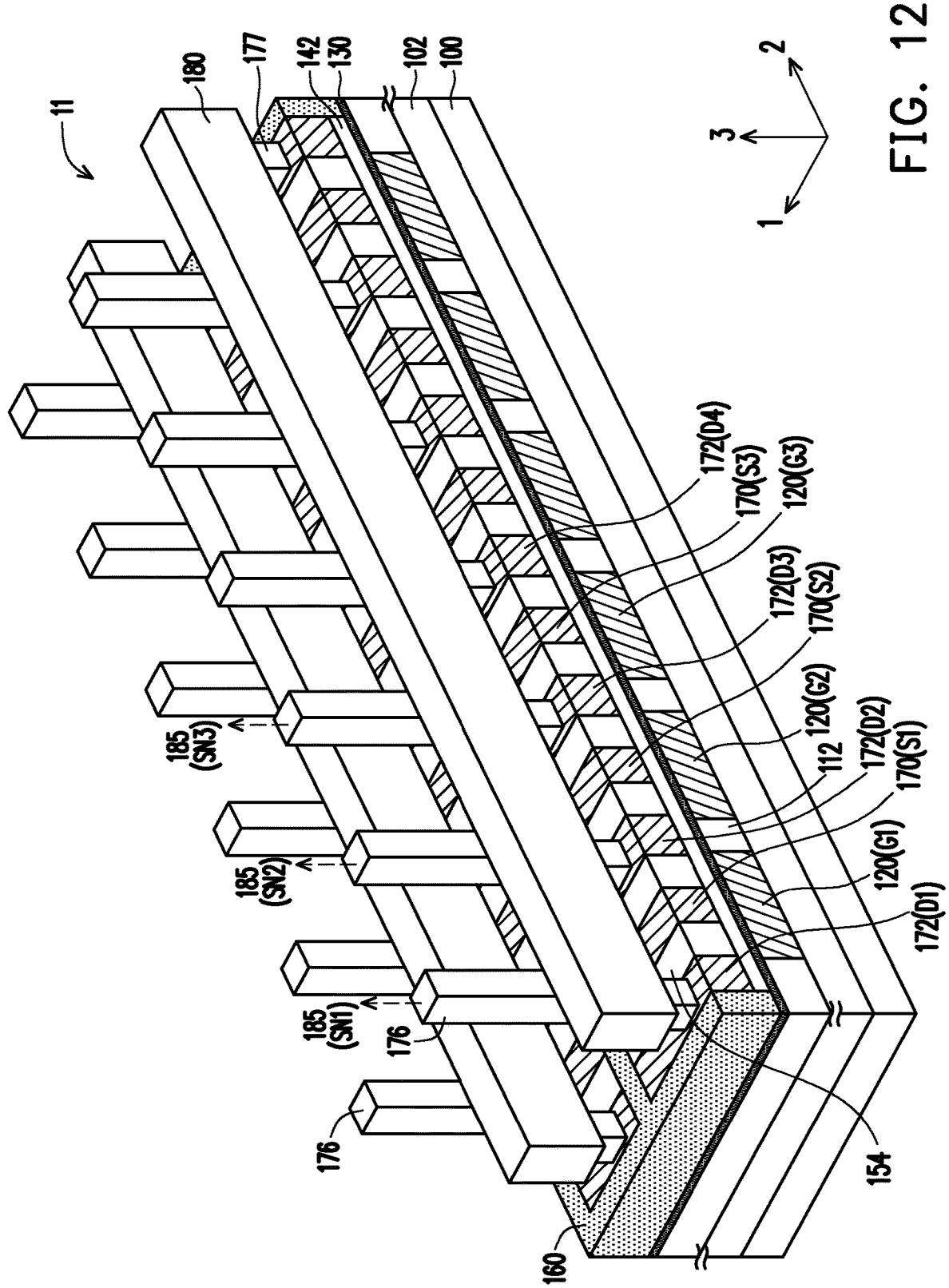
Figure 13:
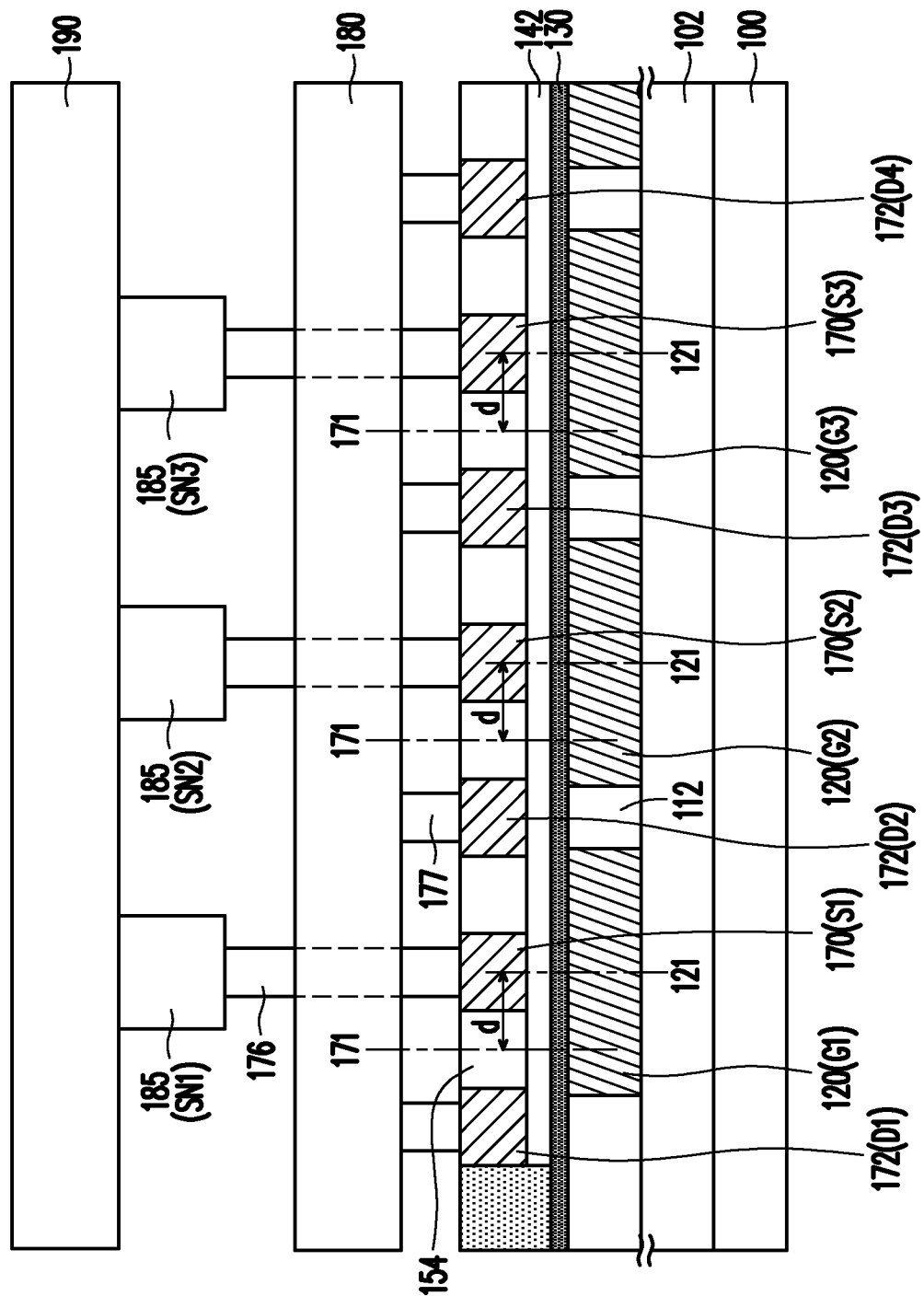
FIG. 13 is a simplified cross-sectional view of a semiconductor structure in accordance with other embodiments.
Figure 14:
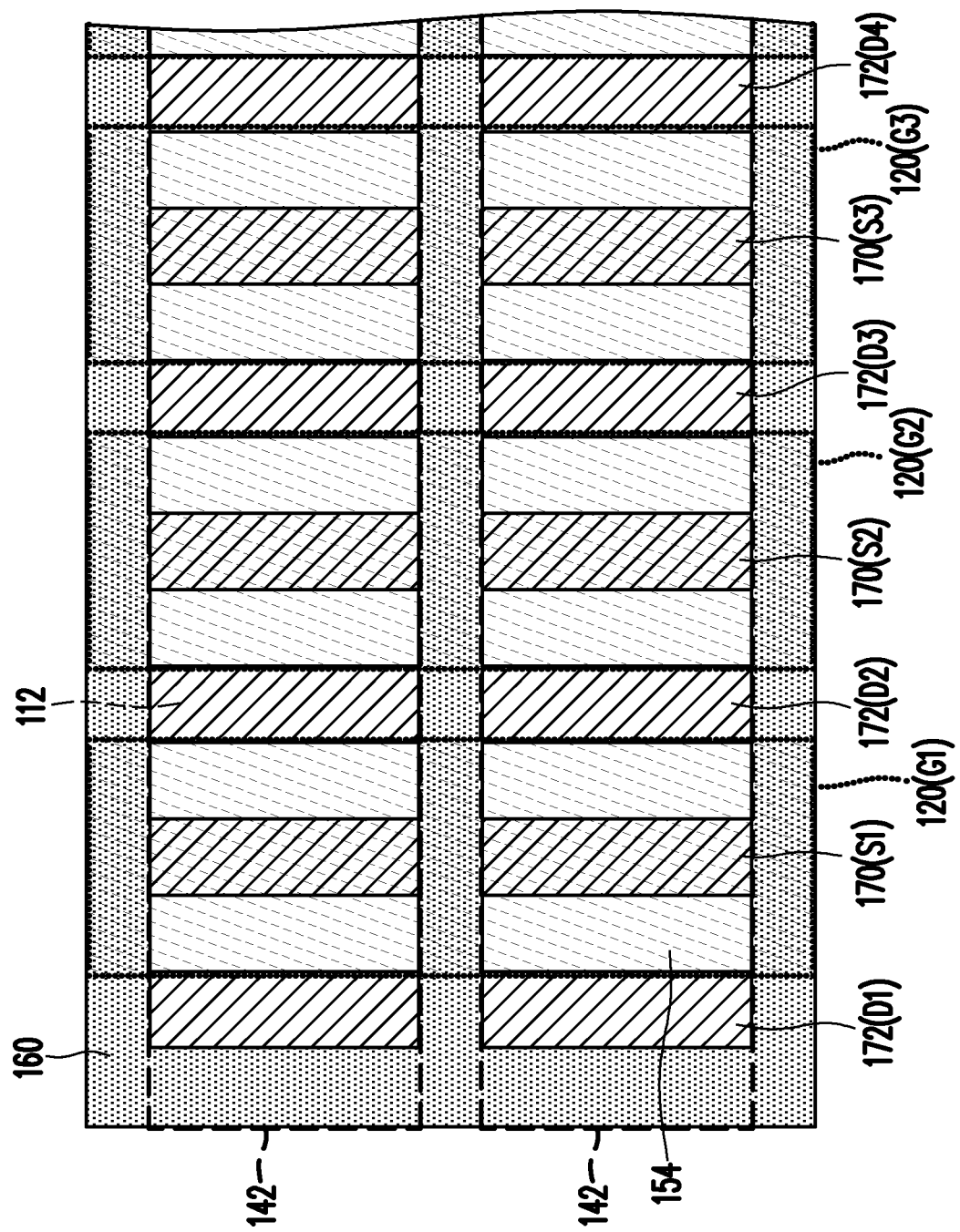
FIG. 14 is a simplified top view of a semiconductor structure in accordance with other embodiments.

FIG. 11 to FIG. 12 are simplified perspective views of a method of forming a semiconductor structure in accordance with some embodiments. Throughout the various views and illustrative embodiments of the present disclosure, like reference numbers are used to designate like elements. It is understood that the disclosure is not limited by the method described below. Additional operations can be provided before, during, and/or after the method and some of the operations described below can be replaced or eliminated, for additional embodiments of the methods. Although FIG. 11 to FIG. 12 are described in relation to a method, it is appreciated that the structures disclosed in FIG. 11 to FIG. 12 are not limited to such a method, but instead may stand alone as structures independent of the method. FIG. 13 is a simplified cross-sectional view of a semiconductor structure in accordance with other embodiments. FIG. 14 is a simplified top view of a semiconductor structure in accordance with other embodiments.

The method of forming the semiconductor structure 11 in FIG. 12 is similar to the method of forming the semiconductor structure 10 in FIG. 8, so the difference between them is illustrated below, and the similarity is not iterated herein.

Firstly, process steps of FIG. 1 to FIG. 7 are implemented, except that source electrodes 170, drain electrodes 172 and second insulation patterns 154 are adjusted to the desired locations in FIG. 11. Specifically, each of the drain electrodes 172 is shifted to fully overlap with the underlying first insulation pattern 112 between two adjacent gate electrodes 120. In some embodiments, the width of the drain electrode 172 is greater than the underlying first insulation pattern 112 between two adjacent gate electrodes 120, as shown in FIG. 13. However, the disclosure is not limited thereto. In other embodiments, the width of the drain electrode 172 is substantially equal to the underlying first insulation pattern 112 between two adjacent gate electrodes 120. In other embodiments, the width of the drain electrode 172 is less than the underlying first insulation pattern 112 between two adjacent gate electrodes 120.

In some embodiments, the source electrodes 170 and the drain electrodes 172 are disposed laterally and arranged alternately on each of the channel patterns 142, and two adjacent source and drain electrodes 170 and 172 are separated by one of the second insulation patterns 154. The line-end source and/or drain electrodes 170 and 172 may be in physical contact with the isolation pattern 160. For examples, the two line-end drain electrodes 172 are in physical contact with the isolation pattern 160, as shown in FIG. 11.

Referring to FIG. 12 and FIG. 13, conductive vias 177 are formed over and electrically connected to the drain electrodes 172, and conductive lines 180 are formed over and electrically connected to the conductive vias 177. Besides, conductive vias 176 are formed over and electrically connected to the source electrodes 170, and conductive lines 190 are formed over and electrically connected to the conductive vias 176. In some embodiments, a storage node 185 is formed between one of the conductive vias 176 and the corresponding conductive line 190. In some embodiments, each of the storage nodes 185 includes a capacitor, such as a metal-insulator-metal (MIM) capacitor, a planar capacitor, a U-shaped capacitor, a vertical capacitor, a horizontal capacitor, a non-capacitor storage structure, or the like.

In some embodiments, a transistor (e.g., thin film transistor (TFT)) is embedded in two adjacent lines of the interconnection structure. In some embodiments, the transistor includes a gate electrode 120, a first insulation pattern 112 disposed aside the gate electrode 120, a gate dielectric layer 130 disposed over the gate electrode 120, a channel pattern 142 disposed over the gate dielectric layer 130, a source electrode 170 and a drain electrode 172 disposed over the channel pattern 142, and a second insulation pattern 154 disposed over the channel pattern 142 between the source electrode 170 and the drain electrode 172. Besides, each drain electrode 172 is fully overlapped with the underlying first insulation pattern 112.

In some embodiments, for the purpose of simplicity and clarity of illustration, the gate electrodes 120 are described as G1, G2, G3 . . . , the source electrodes 170 are described as S1, S2, S3 . . . , the drain electrodes 170 are described as D1, D2, D3, D4 . . . , and storage nodes 185 are described as SN1, SN2, SN3 . . . , starting from the left side of the figure.

In some embodiments, from the top view in FIG. 14, each of the source electrodes 172 is fully overlapped with one of the gate electrodes 120. Specifically, the source electrode S1 is fully overlapped with the gate electrodes G1, the source electrode S2 is fully overlapped with the gate electrodes G2, and the source electrode S3 is fully overlapped with the gate electrodes G3.

In some embodiments, from the cross-sectional view in FIG. 13 and the top view in FIG. 14, each of the drain electrodes 172 is overlapped with one of the entire first insulation pattern 112 and the adjacent gate electrodes 120. Specifically, the drain electrode D2 is overlapped with the underlying entire first insulation pattern 112 and the adjacent gate electrodes G1 and G2, and the drain electrode D3 is overlapped with the underlying entire first insulation pattern 112 and the adjacent gate electrodes G2 and G3.

From another point of view, the boundary of each of the source electrodes 170 is fully within the boundary of one of the gate electrodes 120 in the third direction 3. Besides, each of the drain electrodes 172 may include a first portion overlapping with one of the gate electrodes 120 in the third direction 3, a second portion overlapping with one of the first insulation pattern 152 in the third direction 3, and a third portion overlapping with another of the gate electrodes 120 in the third direction 3.

In some embodiments, from the cross-sectional view in FIG. 13, the central axis 171 between the adjacent source and drain electrodes 170 and 172 is shifted from the central axis 121 of the corresponding gate electrode 120 by a distance d, and d is greater than zero. Specifically, the central axis 171 between the adjacent source and drain electrodes S1 and D1 is shifted from the central axis 121 of the corresponding gate electrode G1, the central axis 171 between the adjacent source and drain electrodes S2 and D2 is shifted from the central axis 121 of the corresponding gate electrode G2, and the central axis 171 between the adjacent source and drain electrodes S3 and D3 is shifted from the central axis 121 of the corresponding gate electrode G3. The transistor of the disclosure is referred to as "a shifted back-gate transistor" in some examples, because the central axis 171 between the adjacent source and drain electrodes 170 and 172 shifted from (or misaligned with) the central axis 121 of the corresponding gate electrode 120.

The transistor of the disclosure provides a double on-current to the storage node because the gate controls two channels at the same time. In some embodiments, two drain electrodes D1 and D2 can provide currents to the storage node SN2 through the gate electrode G2, and two drain electrodes D2 and D3 can provide currents to the storage node SN3 through the gate electrode G3. Therefore, a leakage current to neighbor cell is very low due to the minimization of uncontrolled channel.

In some embodiments, in the case where the semiconductor structure 11 is applied to a memory device such as DRAM, the source electrodes 170 may be connected to the storage nodes 185 through the conductive vias 176, the drain electrodes 172 may be connected to bit lines through the conductive vias 177, and the gate electrodes 120 may be connected to word lines. In some embodiments, as shown in FIG. 9, multiple shifted gate devices are provided, the source electrodes S1, S2 and S3 are respectively connected to the storage nodes SN1, SN2 and SN3, the drain electrodes D1, D2 and D3 are respectively connected to the conductive lines 180 serving as bit lines, and the gate electrodes G1, G2 and G3 serve as word lines.

Figure 15:
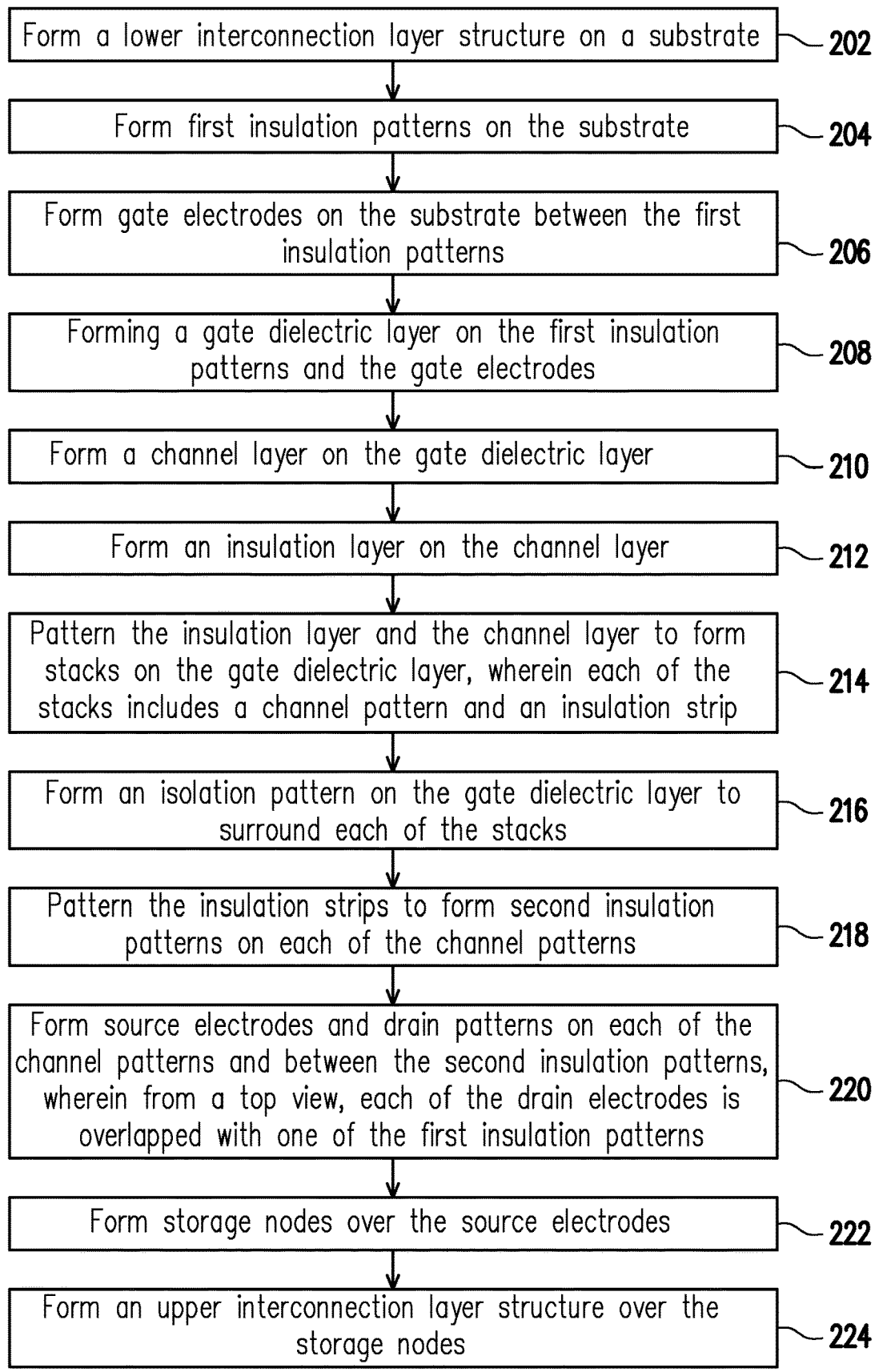
FIG. 15 illustrates a method of forming a semiconductor structure in accordance with some embodiments.

FIG. 15 illustrates a method of forming a semiconductor structure in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 202, a lower interconnection layer structure is formed on a substrate. FIG. 1 and FIG. 11 illustrate perspective views corresponding to some embodiments of act 202.

At act 204, first insulation patterns are formed on the substrate. FIG. 2 and FIG. 11 illustrate perspective views corresponding to some embodiments of act 204. In some embodiments, the first insulation patterns are formed on the lower interconnection layer structure of act 202.

At act 206, gate electrodes are formed on the substrate between the first insulation patterns. FIG. 2 and FIG. 11 illustrate perspective views corresponding to some embodiments of act 206. In some embodiments, the gate electrodes are electrically connected to the lower interconnection layer structure of act 202.

At act 208, a gate dielectric layer is formed on the gate electrodes and the first insulation patterns. FIG. 3 and FIG. 11 illustrate perspective views corresponding to some embodiments of act 208.

At act 210, a channel layer is formed on the gate dielectric layer. FIG. 4 illustrates a perspective view corresponding to some embodiments of act 210.

At act 212, an insulation layer is formed on the channel layer. FIG. 4 illustrates a perspective view corresponding to some embodiments of act 212.

At act 214, the insulation layer and the channel layer are patterned to form stacks on the gate dielectric layer, wherein each of the stacks includes a channel pattern and an insulation strip. FIG. 5 illustrates a perspective view corresponding to some embodiments of act 214.

At act 216, an isolation pattern is formed on the gate dielectric layer to surround each of the stacks. FIG. 6 illustrates a perspective view corresponding to some embodiments of act 216.

At act 218, the insulation strips are patterned to form second insulation patterns on each of the channel patterns. FIG. 7 and FIG. 11 illustrate perspective views corresponding to some embodiments of act 218.

At act 220, source electrodes and drain patterns are formed on each of the channel patterns and between the second insulation patterns, wherein from a top view, each of the drain electrodes is overlapped with one of the first insulation patterns. FIG. 7 and FIG. 11 illustrate perspective views corresponding to some embodiments of act 220. FIG. 9 and FIG. 13 illustrate cross-sectional views corresponding to some embodiments of act 220. FIG. 10 and FIG. 17 illustrate top views corresponding to some embodiments of act 220.

At act 222, storage nodes are formed over the source electrodes. FIG. 8 and FIG. 12 illustrate perspective views corresponding to some embodiments of act 222. FIG. 9 and FIG. 13 illustrate cross-sectional views corresponding to some embodiments of act 222.

At act 224, an upper interconnection layer structure is formed over the storage nodes. FIG. 9 and FIG. 13 illustrate cross-sectional views corresponding to some embodiments of act 224.

The structures of the disclosure are described with reference to FIG. 8 to FIG. 14. In some embodiments of the present disclosure, a semiconductor structure 10/11 includes gate electrodes 120 and first insulation patterns 112 laterally disposed and alternately arranged on a substrate 100, a gate dielectric layer 130 disposed on the first insulation patterns 112 and the gate electrodes 120, at least one channel pattern 142 disposed on the gate dielectric layer 130, source electrodes 170 and drain electrodes 172 laterally disposed and alternately arranged on the channel pattern 142, and second insulation patterns 154 disposed on the channel pattern between the source and drain electrodes 170 and 172.

In some embodiments, one of the second insulation patterns 154 is disposed between two adjacent source and drain electrodes 170 and 172. In some embodiments, the second insulation patterns 154 are made by the same material (e.g., silicon oxide), but the disclosure is not limited thereto. In other embodiments, the second insulation patterns 154 have a first group of insulators (e.g., silicon oxide) and a second group of insulators (e.g., aluminum oxide) alternately arranged. That is, the elements may be arranged in the following sequence: a first source/drain electrode, a silicon oxide insulator, a second source/drain electrode, an aluminum oxide insulator, a third source/drain electrode, a silicon oxide insulator, a fourth source/drain electrode, an aluminum oxide insulator . . . laterally disposed along the second direction 2.

Besides, from a top view, each of the drain electrodes 172 is overlapped with one of the first insulation patterns 112. In some embodiments, from the top view and the cross-sectional view, each of the drain electrodes 172 is further overlapped with at least one of the gate electrodes 120, as shown in FIG. 9, FIG. 10, FIG. 13 and FIG. 14. For example, each of the drain electrodes 172 is further overlapped with one of the gate electrodes 120, as shown in FIG. 9 and FIG. 10. For example, each of the drain electrodes 172 is further overlapped with two of the gate electrodes 120, as shown in FIG. 13 and FIG. 14.

In some embodiments, from the top view, a boundary of each of the source electrodes 170 is completely within a boundary of one of the gate electrodes 120, as shown in FIG. 10 and FIG. 14.

In some embodiments, the at least one channel pattern 142 is continuously disposed across the gate electrodes 120 and first insulation patterns 112, as shown in FIG. 9 and FIG. 13. That is, a continuous channel pattern (e.g., a strip-like channel pattern) is provided for multiple TFTs. In some embodiments, the gate dielectric layer 130 is continuously disposed across the first insulation patterns 112 and the gate electrodes 120, as shown in FIG. 9 and FIG. 13. However, the disclosure is not limited. In other embodiments, multiple separate channel patterns (e.g., island-like channel patterns) may be provided for multiple TFTs, respectively.

In some embodiments, the gate electrodes 120 and the first insulation patterns 112 extend along a first direction 1, and the at least one channel pattern 142 extends along a second direction 2 different from the first direction, as shown in FIG. 8, FIG. 10, FIG. 12 and FIG. 14.

In some embodiments, the semiconductor structure 10/11 further includes an isolation pattern 160 surrounding the at least one channel pattern 142. In some embodiments, a material of the isolation pattern 160 is different from a material of the second insulation patterns 154.

In some embodiments, the semiconductor structure 10/11 further includes storage nodes 185 disposed over and electrically connected to the source electrodes 170.

In some embodiments, a material of the channel pattern 142 includes an oxide semiconductor. In some embodiments, a material of the gate dielectric layer 130 includes silicon oxide, a high-k dielectric material or a combination thereof. In some embodiments, each of the gate electrodes 120, the source electrodes 170 and the drain electrodes 172 includes a single metal. In other embodiments, each of the gate electrodes 120, the source electrodes 170 and the drain electrodes 172 includes a metal material and a barrier material surrounding the sidewall and bottom of the metal material.

In some embodiments, a semiconductor structure 10/11 includes at least one gate electrode 120 disposed on a substrate 100, a gate dielectric layer 130 disposed on the gate electrode 120 (e.g., G2), a channel pattern 142 disposed on the gate dielectric layer 130, a source electrode 170 (e.g., S2) and a drain electrode 172 (e.g., D2) disposed on the channel pattern 142, and a storage node 185 (e.g., SN2) disposed over and electrically connected to the source electrode 170 (e.g., S2). Besides, a central axis 171 between the source electrode 170 (e.g., S2) and the drain electrode 172 (e.g., D2) is shifted from a central axis 121 of the gate electrode 120 (e.g., G2).

In some embodiments, the at least one gate electrode 120 includes two gate electrodes 120 (e.g., G2 and G3) laterally disposed on the same channel pattern 142, and one first insulation pattern 112 is disposed between the two gate electrodes 120 (e.g., G2 and G3), as shown in FIG. 9 and FIG. 13. In some embodiments, the drain electrode 172 (e.g., D2) disposed right above the first insulation pattern 112 is disposed right between the two gate electrodes 120 (e.g., G2 and G3), as shown in FIG. 13.

In some embodiments, from a top view, the drain electrode 172 (e.g., D2) is overlapped with a portion of the first insulation pattern 112, as shown in FIG. 9. In some embodiments, from a top view, the drain electrode 172 (e.g., D2) is overlapped with the entire first insulation pattern 112, as shown in FIG. 13.

In some embodiments, from a top view, the drain electrode 172 (e.g., D2) is overlapped with at least one of the two gate electrodes, as shown in FIG. 9 and FIG. 13. In some embodiments, the drain electrode 172 (e.g., D2) is overlapped with only one (e.g., G2) of the two gate electrodes, as shown in FIG. 9. In some embodiments, the drain electrode 172 (e.g., D2) is overlapped with both (e.g., G2 and G3) of the two gate electrodes, as shown in FIG. 13.

In other embodiments, from a top view, the drain electrode 172 is overlapped with the first insulation pattern 112 between two gate electrodes 120, but separated from the same two gate electrodes 120.

In other embodiments, from a top view, the drain electrode 172 is overlapped with the first insulation pattern 112 between two gate electrodes 120, and edges of the drain electrode 172 is substantially aligned with the opposite facing edges of the two gate electrodes 120.

In some embodiments, the semiconductor structure 10/11 further includes an interconnection layer structure (e.g., 190) disposed over the storage node 185.

In some embodiments of the disclosure, a back-gate of a semiconductor structure is shifted to fully overlap the source electrode region and therefore the storage node region, so that the leakage current of the storage node is inhibited and the performance of the device is accordingly improved. Such shifted back-gate design can always fully control storage node considering every process/photolithography variation According to some embodiments, a semiconductor structure includes: gate electrodes and first insulation patterns laterally disposed and alternately arranged on a substrate, a gate dielectric layer disposed on the gate electrodes and the first insulation patterns, at least one channel pattern disposed on the gate dielectric layer, source electrodes and drain electrodes laterally disposed and alternately arranged on the channel pattern, and second insulation patterns disposed on the channel pattern between the source and drain electrodes. Besides, from a top view, each of the drain electrodes is overlapped with one of the first insulation patterns.

According to some embodiments, a semiconductor structure includes at least one gate electrode disposed on a substrate, a gate dielectric layer disposed on the gate electrode, a channel pattern disposed on the gate dielectric layer, a source electrode and a drain electrode disposed on the channel pattern, and a storage node disposed over and electrically connected to the source electrode. Besides, a central axis between the source electrode and the drain electrode is shifted from a central axis of the gate electrode.

According to some embodiments, a method of forming a semiconductor structure includes: forming first insulation patterns on a substrate; forming gate electrodes on the substrate between the first insulation patterns; forming a gate dielectric layer on the gate electrodes and the first insulation patterns; forming a channel layer on the gate dielectric layer;

forming an insulation layer on the channel layer; patterning the insulation layer and the channel layer to form stacks spaced apart from each other on the gate dielectric layer, wherein each of the stacks comprises a channel pattern and an insulation strip stacked on the channel pattern; forming an isolation pattern on the gate dielectric layer to surround each of the stacks; patterning the insulation strips to form second insulation patterns spaced apart from each other on each of the channel patterns; and forming source electrodes and drain patterns on each of the channel patterns and between the insulation patterns, wherein from a top view, each of the drain electrodes is overlapped with one of the first insulation patterns.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   gate electrodes and first insulation patterns laterally disposed and alternately arranged on a substrate;
   a gate dielectric layer disposed on the gate electrodes and the first insulation patterns;
   at least one channel pattern disposed on the gate dielectric layer;
   source electrodes and drain electrodes laterally disposed and alternately arranged on the channel pattern; and
   second insulation patterns disposed on the channel pattern, wherein one of the second insulation patterns is disposed between two adjacent source and drain electrodes,
   wherein from a top view, each of the drain electrodes is overlapped with one of the first insulation patterns, and
   wherein the semiconductor structure further comprises an isolation pattern surrounding the at least one channel pattern.

2. The semiconductor structure of claim 1, wherein from the top view, each of the drain electrodes is further overlapped with at least one of the gate electrodes.

3. The semiconductor structure of claim 1, wherein from the top view, a boundary of each of the source electrodes is completely within a boundary of one of the gate electrodes.

4. The semiconductor structure of claim 1, wherein the at least one channel pattern is continuously disposed across the gate electrodes and first insulation patterns.

5. The semiconductor structure of claim 1, wherein the gate dielectric layer is continuously disposed across the gate electrodes and the first insulation patterns.

6. The semiconductor structure of claim 1, wherein the gate electrodes and the first insulation patterns extend along a first direction, and the at least one channel pattern extends along a second direction different from the first direction.

7. The semiconductor structure of claim 1, further comprising storage nodes disposed over and electrically connected to the source electrodes, respectively.

8. The semiconductor structure of claim 1, wherein a material of the isolation pattern is different from a material of the second insulation patterns.

9. The semiconductor structure of claim 1, further comprising storage nodes disposed over and electrically connected to the source electrodes.

10. The semiconductor structure of claim 1, wherein a material of the channel pattern comprises an oxide semiconductor.

11. A semiconductor structure, comprising:
    at least one gate electrode disposed on a substrate;
    a gate dielectric layer disposed on the gate electrode;
    a channel pattern disposed on the gate dielectric layer;
    a source electrode and a drain electrode disposed on the channel pattern; and
    a storage node disposed over and electrically connected to the source electrode,
    wherein a central axis between the source electrode and the drain electrode is shifted from a central axis of the gate electrode, and
    wherein the at least one gate electrode comprises two gate electrodes laterally disposed on the same channel pattern, and one first insulation pattern is disposed between the two gate electrodes.

12. The semiconductor structure of claim 11, wherein the semiconductor structure further comprises an interconnection layer structure disposed over the storage node.

13. The semiconductor structure of claim 12, wherein from a top view, the drain electrode is overlapped with at least a portion of the first insulation pattern.

14. The semiconductor structure of claim 12, wherein from a top view, the drain electrode is overlapped with the entire first insulation pattern.

15. The semiconductor structure of claim 12, wherein from a top view, the drain electrode is overlapped with at least one of the two gate electrodes.

16. The semiconductor structure of claim 11, wherein further comprising a device layer disposed between the substrate and the at least one gate electrode.

17. A method of forming a semiconductor structure, comprising:
    forming gate electrodes and first insulation patterns laterally disposed and alternately arranged on a substrate;
    forming a gate dielectric layer on the gate electrodes and the first insulation patterns;
    forming at least one channel pattern on the gate dielectric layer;
    forming source electrodes and drain electrodes laterally disposed and alternately arranged on the channel pattern; and
    forming second insulation patterns on the channel pattern, wherein one of the second insulation patterns is disposed between two adjacent source and drain electrodes,
    wherein from a top view, each of the drain electrodes is overlapped with one of the first insulation patterns, and
    wherein the method further comprises forming an isolation pattern surrounding the at least one channel pattern.

18. The method of claim 17, wherein from the top view, each of the drain electrodes is further overlapped with at least one of the gate electrodes.

19. The method of claim 17, further comprising forming storage nodes over the source electrodes.

20. The method of claim 19, further comprising:
    forming a lower interconnection layer structure on the substrate before forming the first insulation patterns; and forming an upper interconnection layer structure on the substrate after forming the storage nodes.

\* \* \* \* \*